United States Patent
Hellbaum et al.

(10) Patent No.: US 6,734,603 B2
(45) Date of Patent: May 11, 2004

(54) THIN LAYER COMPOSITE UNIMORPH FERROELECTRIC DRIVER AND SENSOR

(75) Inventors: Richard F. Hellbaum, Hampton, VA (US); Robert G. Bryant, Poquoson, VA (US); Robert L. Fox, Hayes, VA (US); Antony Jalink, Jr., Newport News, VA (US); Wayne W. Rohrbach, Yorktown, VA (US); Joycelyn O. Simpson, Hampton, VA (US)

(73) Assignee: The United States of America as represented by the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 08/797,553

(22) Filed: Jan. 24, 1997

(65) Prior Publication Data

US 2001/0043027 A1 Nov. 22, 2001

Related U.S. Application Data

(63) Continuation of application No. 08/416,598, filed on Apr. 4, 1995, now Pat. No. 5,632,841.

(51) Int. Cl.$^7$ .............................................. H01L 41/08
(52) U.S. Cl. ...................................... 310/330; 310/332
(58) Field of Search .............................. 156/160, 163, 156/165, 245; 29/25.35; 310/330, 331, 332, 340, 345, 367, 369, 370, 371, 311, 328; 264/229

(56) References Cited

U.S. PATENT DOCUMENTS

| | | | | |
|---|---|---|---|---|
| 3,317,762 A | * | 5/1967 | Corwin et al. | 310/371 X |
| 3,588,552 A | * | 6/1971 | Schafft | 310/371 X |
| 3,622,815 A | * | 11/1971 | Schafft | 310/332 |
| 3,631,383 A | * | 12/1971 | Zilinskas | 29/25.35 X |
| 3,666,979 A | * | 5/1972 | McElroy | 310/371 |
| 4,435,667 A | * | 3/1984 | Kolm et al. | 310/330 X |
| 4,539,575 A | * | 9/1985 | Nilsson | 310/330 X |
| 4,716,331 A | * | 12/1987 | Higgins, Jr. | 310/330 |
| 5,042,493 A | * | 8/1991 | Saito et al. | 128/662.03 |
| 5,126,000 A | * | 6/1992 | Takai et al. | 156/285 |
| 5,231,326 A | * | 7/1993 | Echols, John C. | 310/330 X |
| 5,404,067 A | * | 4/1995 | Stein et al. | 310/330 |
| 5,589,725 A | * | 12/1996 | Haertling | 310/330 X |
| 5,687,462 A | * | 11/1997 | Lazarus et al. | 310/330 X |
| 5,767,612 A | * | 6/1998 | Takeuchi et al. | 310/330 X |

* cited by examiner

Primary Examiner—Mark Budd
(74) Attorney, Agent, or Firm—Robin W. Edwards; Kurt G. Hammerle; Linda B. Blackburn

(57) ABSTRACT

A method for forming ferroelectric wafers is provided. A prestress layer is placed on the desired mold. A ferroelectric wafer is placed on top of the prestress layer. The layers are heated and then cooled, causing the ferroelectric wafer to become prestressed. The prestress layer may include reinforcing material and the ferroelectric wafer may include electrodes or electrode layers may be placed on either side of the ferroelectric layer. Wafers produced using this method have greatly improved output motion.

8 Claims, 8 Drawing Sheets

US 6,734,603 B2

THIN LAYER COMPOSITE UNIMORPH FERROELECTRIC DRIVER AND SENSOR

This application is a continuing application of commonly-owned patent application Ser. No. 08/416,598, filed Apr. 4, 1995, now U.S. Pat. No. 5,632,841.

ORIGIN OF THE INVENTION

The invention described herein was made by employees of the United States Government and may be used by and for the Government for governmental purposes without the payment of any royalties thereon or therefor.

BACKGROUND OF THE INVENTION

1. Technical Field of the Invention

The present invention relates generally to ferroelectric devices, and more particularly to ferroelectric devices providing large mechanical output displacements.

2. Discussion of the Related Art

Prior art methods include 'Rainbow' piezoelectric actuators and sensors, more conventional piezoelectric actuators and sensors, and electro-magnetic actuators.

Conventional piezoelectric actuators exhibit limited mechanical displacements. The output of conventional piezoelectric devices is limited by the material's basically low piezoelectric displacement constant. Thus conventional devices of reasonable thickness (i.e. on the order of a few millimeters) offer only micrometer-sized mechanical output motion. 'Rainbow' actuators, 'Moonies', unimorphic, and bimorphic piezoelectric actuators exhibit greater mechanical output motion. However even the thinnest ceramic wafers, which exhibit the maximum observed output motion, provide a displacement limited to approximately 1 mm of motion in the z-direction for a device that is 3–4 cm long. Additionally ¼ mm thick ceramic devices are extremely brittle and fragile so that they are prone to breakage and require special handling. Previous methods of forming 'Rainbow' actuators include an additional chemical reduction process which releases lead vapors from the wafer into the atmosphere.

It is accordingly an object of the present invention to provide a ferroelectric actuator with improved mechanical displacement.

It is another object of the present invention to provide a ferroelectric actuator with improved durability.

It is another object of the present invention to provide a ferroelectric actuator with improved machinability.

It is another object of the present invention to provide a method for producing a ferroelectric actuator which is more environmentally safe than previous methods.

It is yet another object of the present invention to accomplish the foregoing objects in a simple manner.

Additional objects and advantages of the present invention are apparent from the drawings and specification which follow.

SUMMARY OF THE INVENTION

According to the present invention, the foregoing and additional objects are obtained by providing a method for producing ferroelectric devices. First, a mold is selected for the device. A prestress layer is placed on the mold and a ferroelectric layer is placed on top of the prestress layer. These layers are bonded together by heating and then cooling the assembled device. The prestress layer may be an adhesive and may include reinforcing material. The ferroelectric layer may be a piezoelectric material, a piezostrictive material or a composite. The ferroelectric layer includes surface electrodes which may be applied by including an electrode layer on either side of the ferroelectric layer prior to heating the assembly.

DETAILED DESCRIPTION OF THE PREFERRED EMBODIMENT

Figure 1:
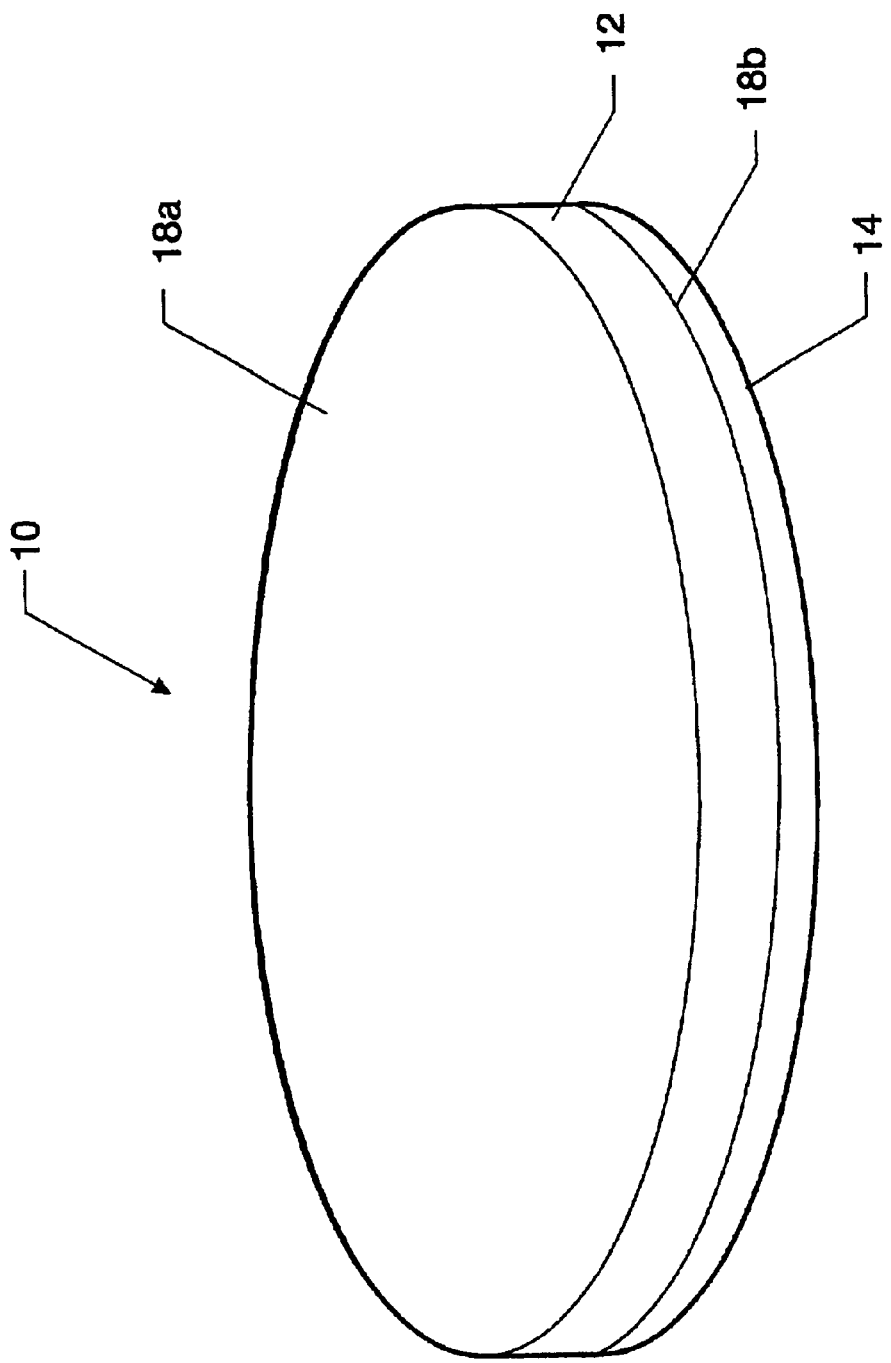
FIG. 1 is a perspective view of the preferred embodiment prior to bonding the layers.

FIG. 1 shows a piezoelectric device 10 according to the present invention prior to being processed. The device includes four layers, a piezoelectric layer 12, a prestressing layer 14 and two electrode layers 18a and 18b. The piezoelectric layer 12 can be made from a disk of piezoelectric material commercially available from Aura Ceramics (C3900 material) or Morgan Matrox. Alternatively, this layer can be made from piezoelectric material that was first ground to a fine powder and subsequently consolidated into a layer by compression bonding the powder with an adhesive such as a polyimide, as shown in "Tough, Soluble, Aromatic, Thermoplastic Copolyimides", Ser. No. 08/359,752, filed Dec. 16, 1994. Note that in the latter approach, the adhesive binder makes up a very small fraction, typically 5 percent by weight, of the finished piezoelectric layer 12. This latter approach is attractive since the required bonding operation can simply be performed simultaneously with other needed bonding operations discussed in the next paragraph. In addition to piezoelectric materials, other ferroelectric materials, including piezostrictive materials may be used to form this layer.

Figure 2:
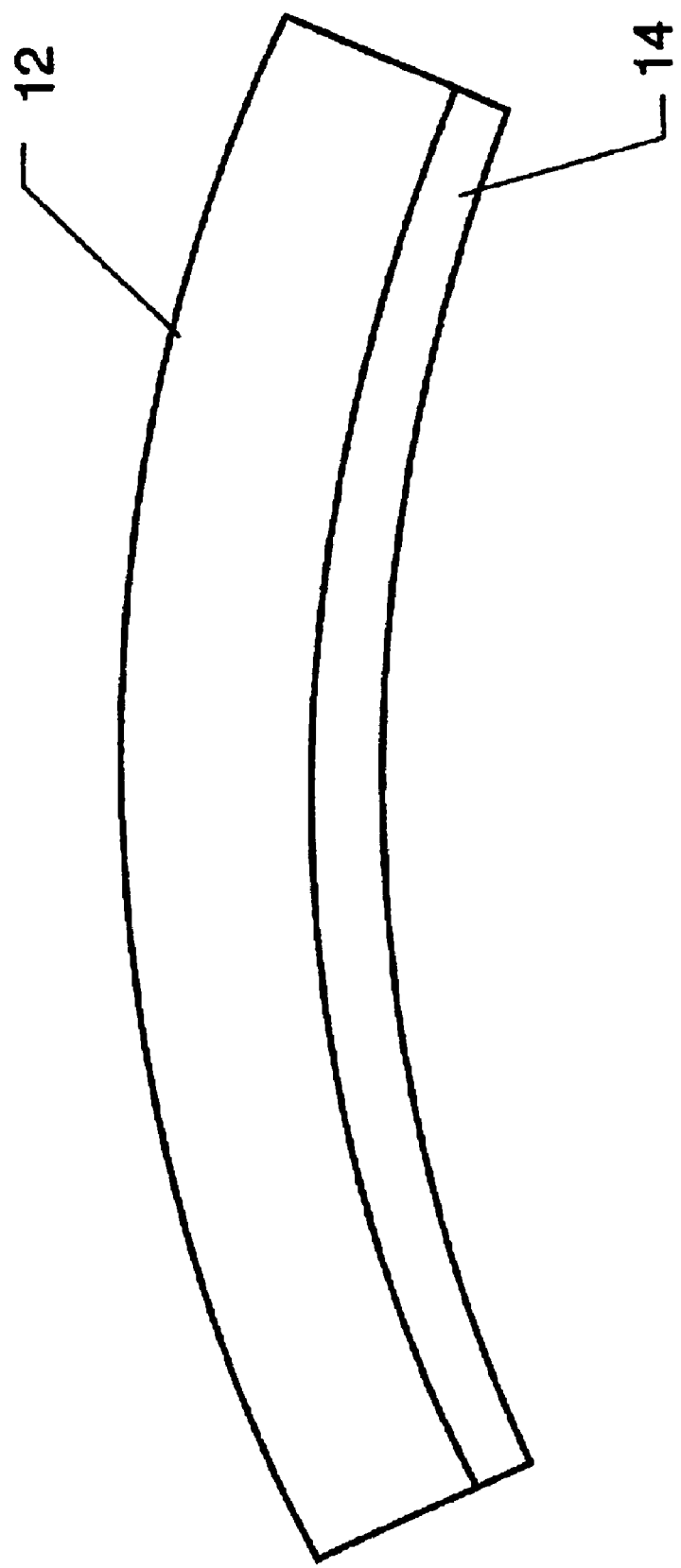
FIG. 2 is a cross sectional view of the preferred embodiment after cooling of the layers.
Figure 3:
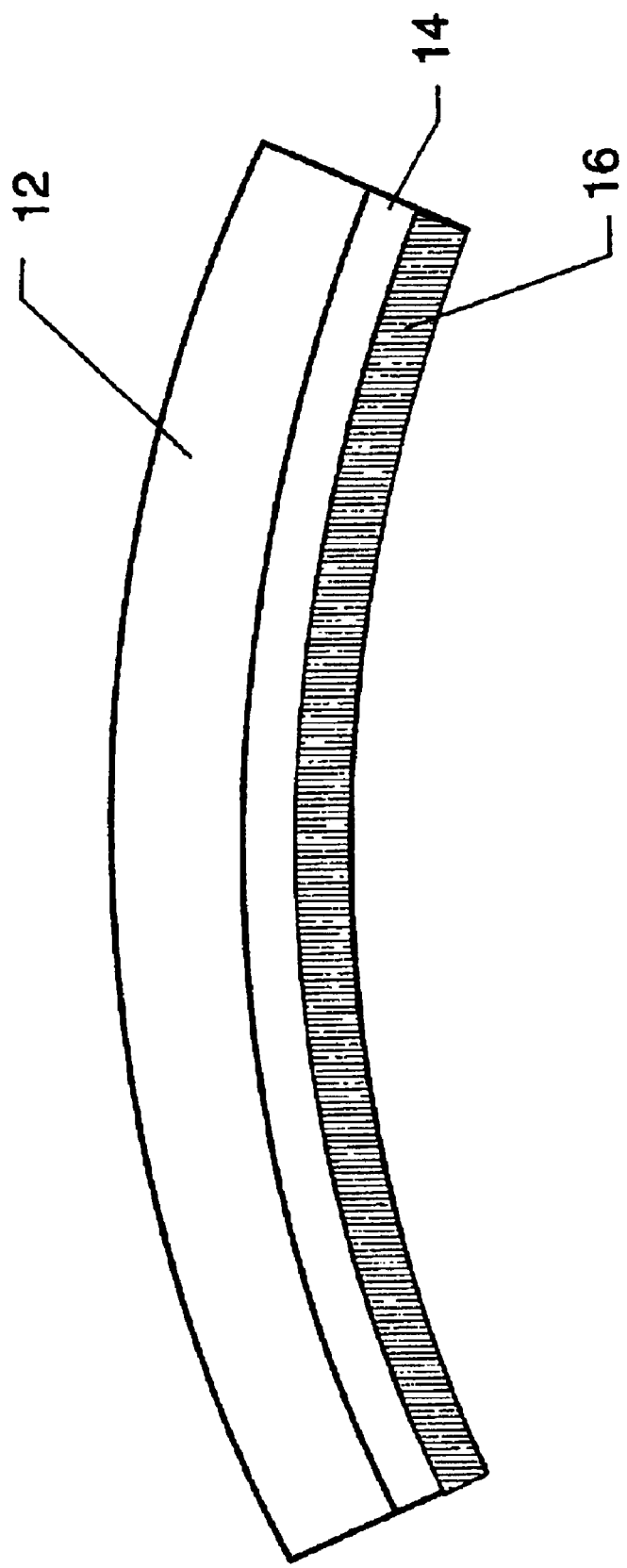
FIG. 3 is a cross sectional view of an alternate embodiment of the present invention.
Figure 4:
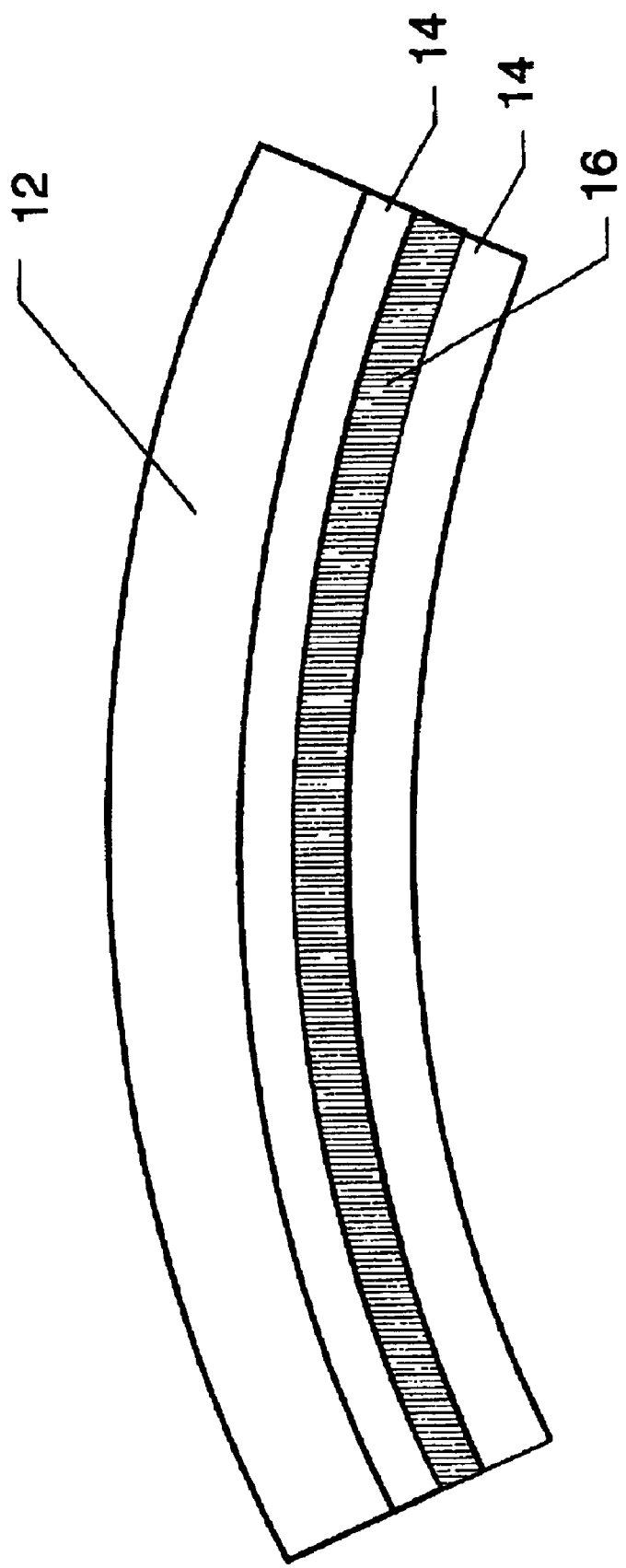
FIG. 4 is a cross sectional view of an alternate embodiment of the present invention.

The prestressing layer 14 can be made of a mechanically strong adhesive such as a polyimide. Thermoplastics, thermosets and braze alloys may also be used for this layer 14. Additionally, multiple prestress layers 14 may be used to provide increased prestress. The adhesive is wet-coated or a thin film is melted onto one surface of the piezoelectric layer 12 and then bonded to it at an elevated temperature which is dependent on the adhesive being used and allows the material to undergo cure, drying, and/or melt flow. The layer of adhesive thus formed is typically twelve microns thick, but can range in thickness from a few microns to several mm. Bonding of the layers occurs at a high temperature, which depends upon the adhesive but is typically 200–350° C., so that when the two-layer composite matrix cools to room temperature, the differential thermal compression rates of the layers automatically impart the desired mechanical prestress into the layers, as shown in FIG. 2. If desired, the prestressing layer 14 of adhesive can be reinforced primarily to allow augmenting the level of prestress, but also for mechanical toughness and decreased hysteresis. To accomplish this, a thin layer of reinforcing material 16 is fused or bonded onto (FIG. 3), or into (FIG. 4), the prestressing layer 14. Examples of reinforcing materials include, but are not limited to, plastics, ceramics, metals and combinations of these materials such as aluminum sheet stock and carbon fibers. Bonding of the reinforcing material 16 can occur simultaneously with the bonding of the piezoelectric to the prestressing layer.

The adhesive layer allows the thin ceramic wafer to be cut to shape without chipping or fracturing using conventional cutting tools like scissors and pattern cutters allowing tailor-made shapes rather than molded shapes. This method enables techniques to be used which allow the pattern building of 3-dimensional objects from the consolidation of the 2-dimensional flat ceramic shapes. These layers can also offer additional environmental protection which allows these devices to be used in harsh conditions. If the adhesive layer used is a good dielectric, the chances of internal and external arcing due to the applied voltage are reduced.

In one embodiment, the piezoelectric device 10 according to the present invention contains two electrodes 18a and 18b. The electrodes 18a and 18b can be of the more conventional vacuum-deposited metal type, and can be applied onto the piezoelectric layer 12 prior to application of the prestressing layer 14. Alternatively, the electrodes can be a graphite or metal-plus-adhesive mixture such as silver epoxy, which is an excellent conductor. This alternate technique has the advantage that the conductive adhesive mixture can be coated onto the piezoelectric layer 12 and subsequently bonded to the piezoelectric layer 12, simultaneous with the bonding of the prestressing 14 and piezoelectric layers 12. Multiple or patterned electrodes may also be used if necessary for the desired application.

The above teachings, may be combined to simplify the manufacture of piezoelectric devices. Complete devices can be produced by assembling separate layers of different materials, such as the appropriate mixtures of adhesively coated powdered piezoelectric material plus adhesive for the piezoelectric layer, conductive adhesive for the electrodes, and the adhesive by itself or as reinforcement for the prestressing layer, followed by a single high-temperature bonding operation as described in "Tough, Soluble, Aromatic, Thermoplastic Copolyimides", Ser. No. 08/359,752, filed Dec. 16, 1994.

Provisions should be made during the manufacturing process to ensure that the finished piezoelectric device has its prestressing layer in tension which places the piezoelectric material in the desired compression. The amount of prestress in the piezoelectric material can be tailored during manufacture in order to maximize the output motion and efficiency of the final device. The material layers may be formed on a curve-shaped mold.

Figure 5:
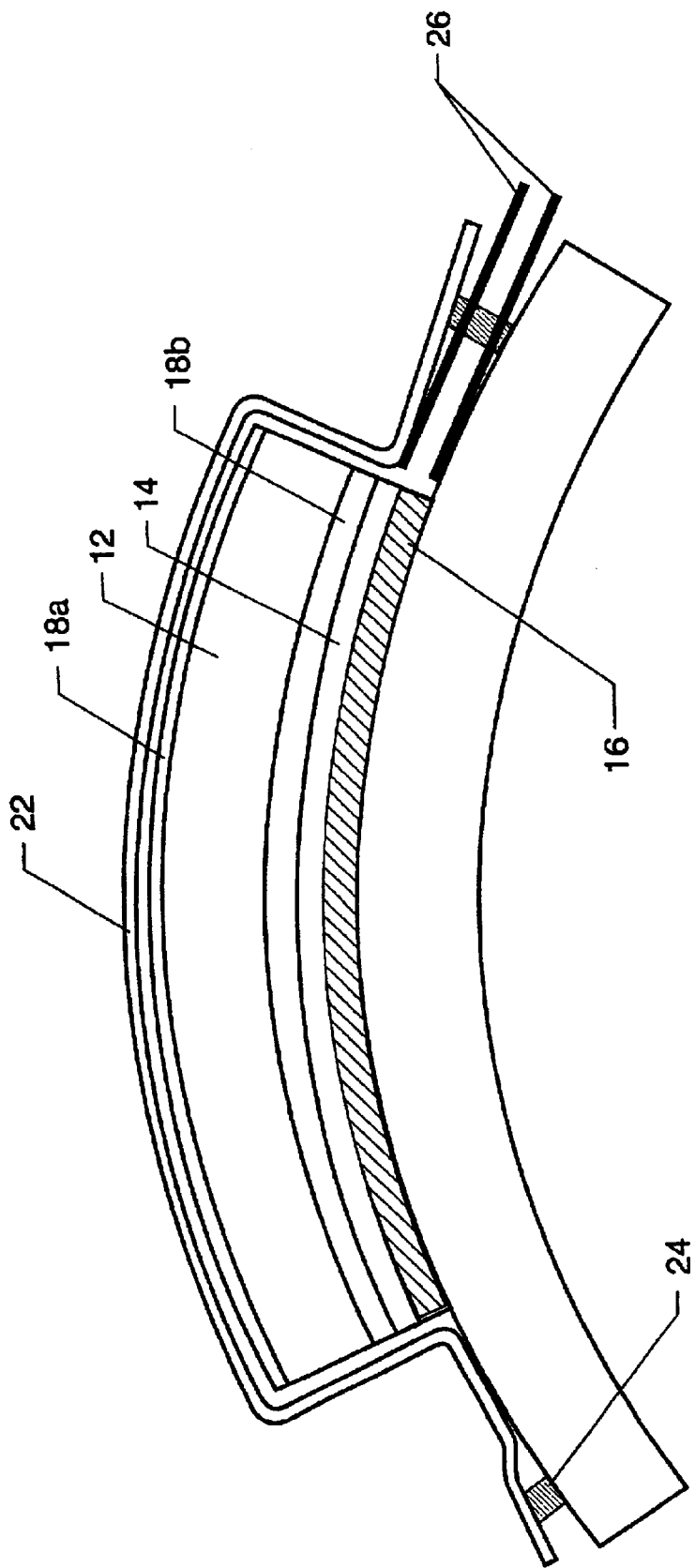
FIG. 5 is a cross sectional view showing the manufacturing process of the present invention.

A description typical of fabricating a prestressed device 10 by hand is provided here and shown in FIG. 5. A molding surface 20 is selected for the amount of curvature needed to provide the desired prestress. The prestress reinforcing layer 16 of aluminum foil is then placed on top of the molding surface 20. Next the adhesive prestress layer 14 made from a polyimide as described in "Tough, Soluble, Aromatic, Thermoplastic Copolyimides", Ser. No. 08/359,752, filed Dec. 16, 1994 is placed on top of the reinforcing layer 16. The electrode layer 18b of silver is vacuum deposited on the lower surface of the piezoelectric wafer 12 (this step is unnecessary if pre-electroded piezoelectric wafers are being used). The piezoelectric wafer 12 is placed on top of the adhesive prestress layer 14. Finally, an electrode layer 18a of silver is vacuum deposited on the upper surface of piezoelectric wafer 12, if necessary. A sheet of high temperature material 22, such as Kapton® (DuPont), is placed over the stack and is sealed using high temperature bagging tape 24 to produce a vacuum bag. The assembly is placed into an oven and the air in the Kapton® bag 22 is evacuated through vacuum port 26. The oven is heated to 300° C. to melt the adhesive and bond the assembly. Upon cooling, the assembly undergoes further prestressing, and the resulting piezoelectric device is removed from the vacuum bag and mold.

Although the ferroelectric wafers are typically poled as received from the vendor, they must be repoled following thermal treatment in the prestress process. The poling is done at an elevated temperature with a DC voltage sufficient to induce dipole orientation. After poling, the wafer is cooled to room temperature in the presence of the electric field to preserve the induced orientation. The DC field strength employed in the polarization is selected to obtain optimum polarization without exceeding the field at which dielectric breakdown occurs in the material at a given poling temperature.

The amount and type of input voltage per unit of deflection, motion, force and output voltage, current, or power conversion can be adjusted by varying the thickness and/or number of layers of the piezoelectric, the number of layers and/or thickness of the prestress layer, the prestress material, the piezoelectric composition and the curvature and shape of the molding surface. By varying the curvature of the mold, the prestress imparted to the finished piezoelectric device is varied. By varying the thickness or number of prestress material layers or by varying the material used, the output motion and mechanical force can also be varied. During processing, the piezoelectric and prestressing layers move with respect to each other and upon cooling bond together with additional prestress. This method of making devices has shown substantial increase of output motion of otherwise identical piezoelectric devices.

Figure 6:
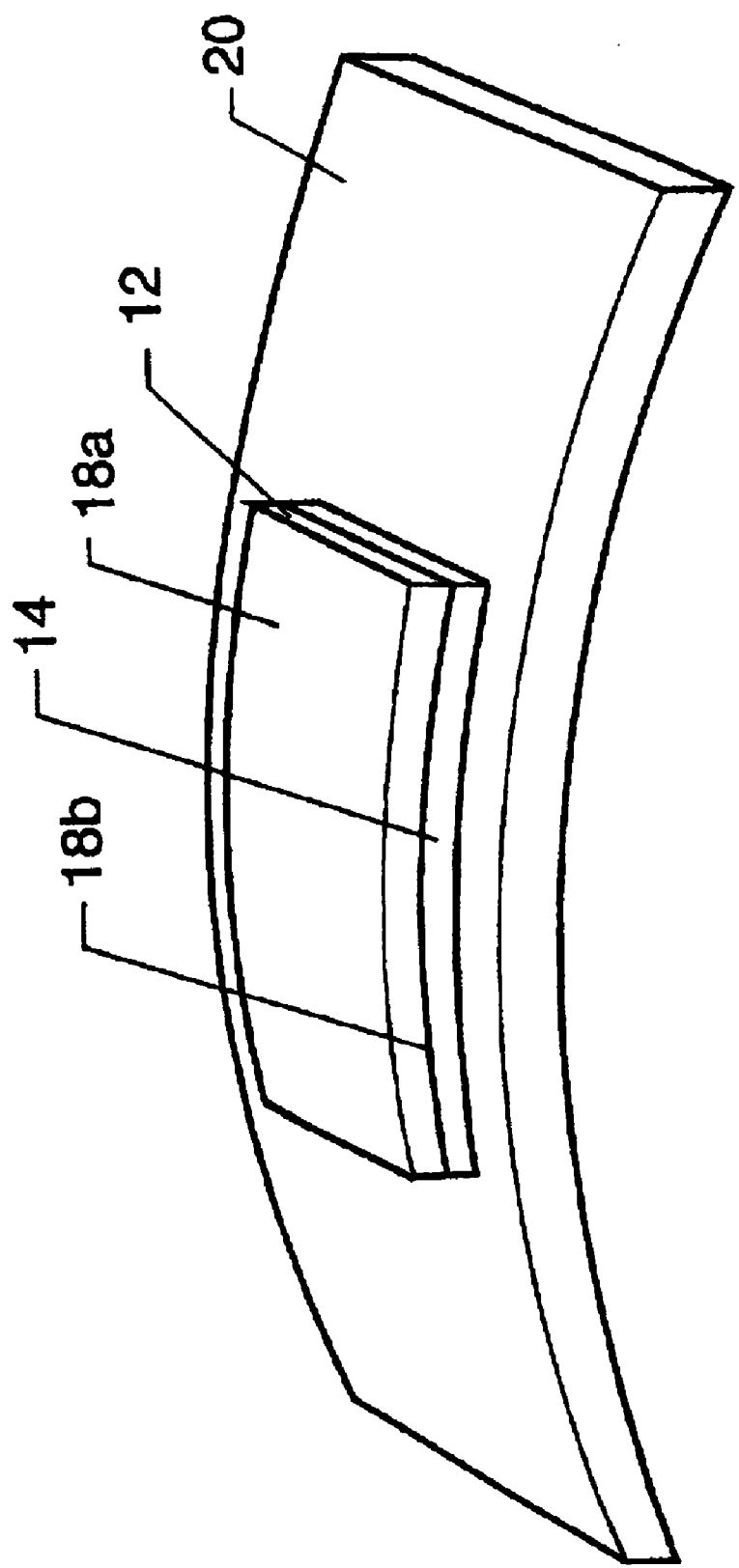
FIG. 6 is perspective view showing an alternate embodiment of the present invention.

A cylindrical bender mode may be emphasized by prestressing in only one direction which can be done by bending the layers over a cylindrical molding surface during the heating cycle. On cooling, the prestressing layer 14, being under the piezoelectric layer 12 has a tighter radius of curvature and prestresses more in one direction thus forming the bender. These cylindrical mode benders are typically shapes other than circular as shown in FIG. 6.

Figure 7:
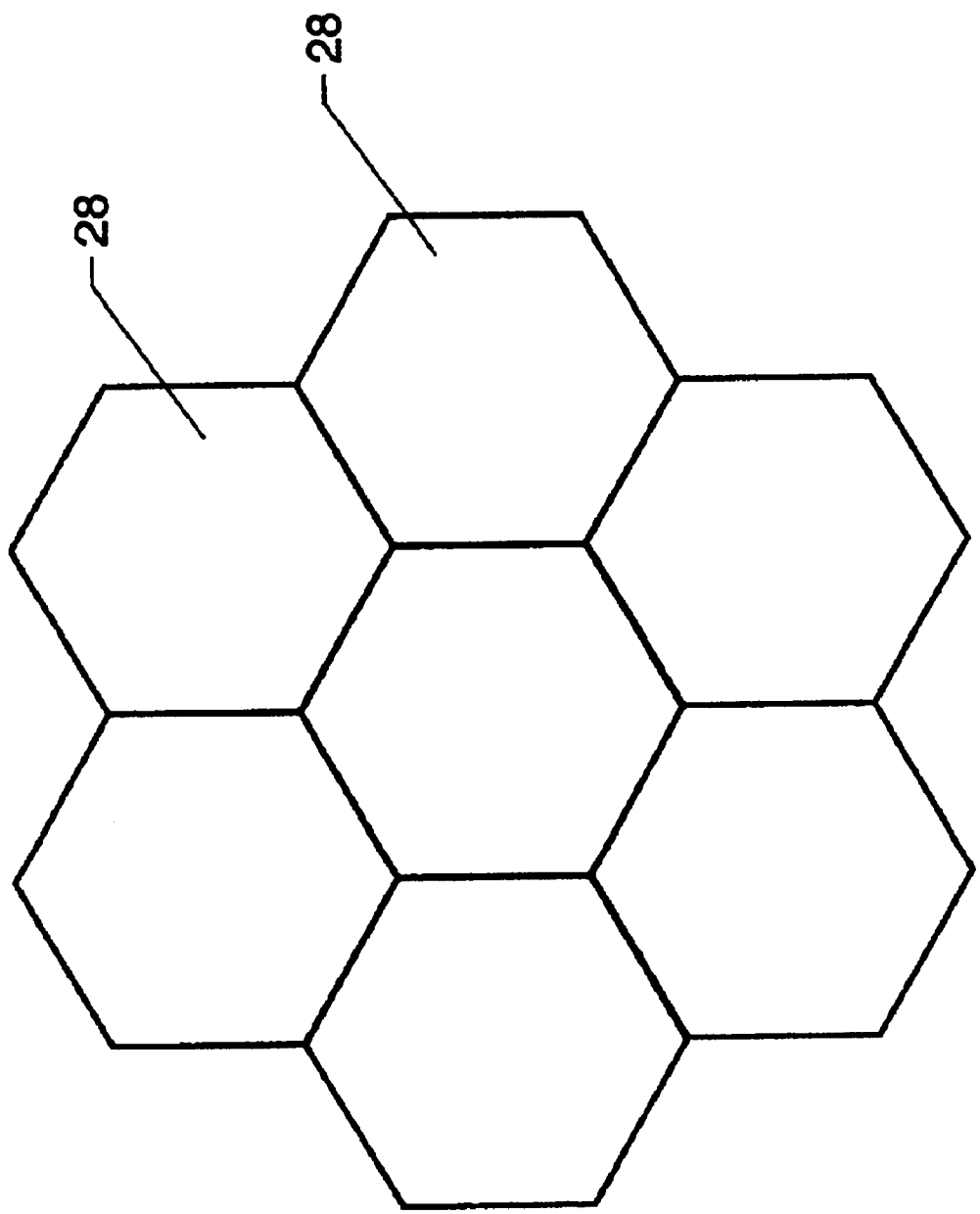
FIG. 7 is a top view showing a plurality of prestressed wafers connected to form a larger wafer.

A number of individual, polygon-shaped piezoelectric devices 28 can be grouped into a large-area mosaic by joining their appropriate edges as shown in FIG. 7. One useful method for edge attachment is the use of a single reinforcing layer that covers the entire mosaic.

Figure 8:
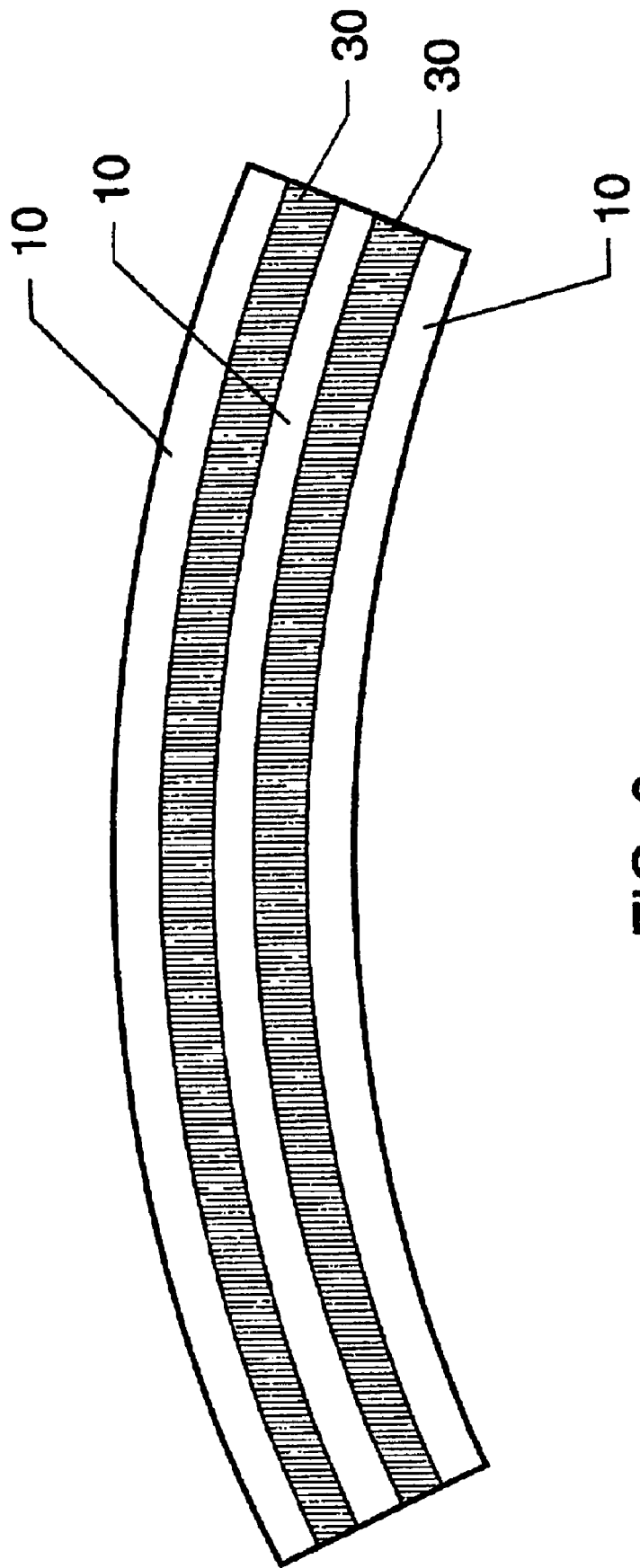
FIG. 8 is a side view showing three of the prestressed wafers in a stacked configuration.

Certain applications may require more mechanical output force than can be provided by a single device 10. Two or more devices 10 can then be used in an efficient tandem arrangement by uniting their dome-like shapes in a 'stacked-spoons' configuration. FIG. 8 shows three devices in this stacked configuration. To allow unimpeded bending of the individual devices during operation the devices can be bonded to each other using a compliant layer 30, such as an elastomer, i.e. silicone rubber, which allows one layer to move relative to the other. In such an actuator stack, the individual devices 10 remain electrically isolated from each other; one or more of the devices 10 can act as a motion feedback sensor.

When made using a matrix composite fabrication method shown in "Tough, Soluble, Aromatic, Thermoplastic Copolyimides", Ser. No. 08/359,752, filed Dec. 16, 1994, large flexible sheets may be produced for use in low-frequency actuator applications (i.e. noise canceling devices or loud speakers). This can be accomplished by using large flat molds for consolidation or a continuous roll process. Molded parts can be bonded together by heating them to soften and/or cure the binder adhesive while pressing them together.

Ferroelectric devices made from the present method can be used in pumps, valves, brakes, motors, sensors, actuators, optics, acoustic transducers, and active structures.

Many improvements, modifications, and additions will be apparent to the skilled artisan without departing from the spirit and scope of the present invention as described herein and defined in the following claims.

What is claimed is:

1. An electroactive device providing large mechanical output displacements, comprising:

a layered structure having a prestressing layer having a convex surface, and a piezoelectric layer having a concave surface, the convex surface of the prestressing layer being bonded onto the concave surface of the piezoelectric layer such that the prestressing layer is in tension and imparts a prestress on the piezoelectric layer such that the piezoelectric layer is in compression, wherein the prestressing layer and the piezoelectric layer are distinct from one another.

2. The device of claim 1, wherein the prestressing layer includes reinforcing material.

3. The device of claim 1, wherein the piezoelectric layer includes surface electrodes.

4. The device of claim 1, further comprising:

an electrode layer placed between the prestressing layer and the piezoelectric layer; and an electrode layer placed on top of the piezoelectric layer.

5. The device of claim 1, wherein the prestressing layer is an adhesive.

6. The device of claim 1, where the piezoelectric layer is a ferroelectric material.

7. The device of claim 1, wherein the piezoelectric layer is a piezorestrictive material.

8. The device of claim 5, wherein the adhesive is a polyimide.

* * * * *